US009036675B2

(12) United States Patent
Obika et al.

(10) Patent No.: US 9,036,675 B2
(45) Date of Patent: May 19, 2015

(54) COMMUNICATION MODULE AND PORTABLE ELECTRONIC DEVICE

(75) Inventors: Akira Obika, Kyoto (JP); Masayuki Kitagawa, Kyoto (JP)

(73) Assignee: ROHM CO. LTD., Kyoto (JP)

( * ) Notice: Subject to any disclaimer, the term of this patent is extended or adjusted under 35 U.S.C. 154(b) by 0 days.

(21) Appl. No.: 14/001,075

(22) PCT Filed: Feb. 24, 2012

(86) PCT No.: PCT/JP2012/054635
§ 371 (c)(1),
(2), (4) Date: Aug. 22, 2013

(87) PCT Pub. No.: WO2012/115246
PCT Pub. Date: Aug. 30, 2012

(65) Prior Publication Data
US 2013/0330090 A1    Dec. 12, 2013

(30) Foreign Application Priority Data
Feb. 25, 2011  (JP) .................................. 2011-040615

(51) Int. Cl.
*H01S 5/00* (2006.01)
*H04B 10/50* (2013.01)
(Continued)

(52) U.S. Cl.
CPC ........... *H04B 10/503* (2013.01); *H01S 5/02228* (2013.01); *H01S 5/02296* (2013.01); *H01S 5/0683* (2013.01); *H01S 5/005* (2013.01); *H01S 5/183* (2013.01); *H01S 5/0228* (2013.01)

(58) Field of Classification Search
CPC ... H04B 10/503; H01S 3/0085; H01S 3/0092; H01S 3/06725; H01S 3/0675; H01S 3/06754; H01S 3/06758; H01S 3/094019; H01S 3/094042; H01S 3/1086; H01S 3/109; H01S 3/11; H01S 3/1106
USPC ........................................ 372/50.23; 398/182
See application file for complete search history.

(56) References Cited

U.S. PATENT DOCUMENTS 6,778,574 B1 *  8/2004  Shimonaka et al. ........ 372/43.01
6,937,824 B2 *  8/2005  Watanabe ..................... 398/135
(Continued)

FOREIGN PATENT DOCUMENTS

JP    2001-156378 A    6/2001
JP    2005-251959 A    9/2005
(Continued)

*Primary Examiner* — Xinning Niu
*Assistant Examiner* — Vu A Vu
(74) *Attorney, Agent, or Firm* — Rabin & Berdo, P.C.

(57) ABSTRACT

A communication module according to the present invention includes a substrate, a laser element and a light receiving element provided on a front surface of the substrate and separating from each other, a transparent resin package collectively sealing the laser element and the light receiving element, and a diffusion unit provided to be opposed to a light emitting surface of the laser element at a prescribed distance for diffusing a laser beam emitted by the laser element, while the distance T between the laser element and the light receiving element satisfies the following formula (1): $T \geq t_1 \cdot \tan \theta + (t_1 + t_2) \cdot \tan \theta' \ldots$ (1) (in the formula (1), $t_1$ represents the distance between the light emitting surface of the laser element and the diffusion unit, $\theta$ represents the maximum angle of emission of the laser element, $t_2$ represents the difference between the height from the front surface of the substrate up to the light emitting surface and the height up to a light receiving surface of the light receiving element, and $\theta'$ represents the maximum diffusion angle of the diffusion unit.)

12 Claims, 10 Drawing Sheets

(51) Int. Cl.
*H01S 5/022* (2006.01)
*H01S 5/0683* (2006.01)
*H01S 5/183* (2006.01)

(56) References Cited

U.S. PATENT DOCUMENTS 6,970,489 B2 * 11/2005 Shimonaka ................ 372/43.01
7,173,951 B2 * 2/2007 Shinohara et al. ............. 372/36
7,182,258 B2 * 2/2007 Foo et al. ..................... 235/454
2009/0162073 A1 6/2009 Ojima et al.

FOREIGN PATENT DOCUMENTS

| | | |
|---|---|---|
| JP | 2006-108358 A | 4/2006 |
| JP | 2006-352105 A | 12/2006 |
| JP | 2007-066947 A | 3/2007 |
| JP | 2007-250785 A | 9/2007 |
| JP | 2009-151041 A | 7/2009 |
| WO | WO-00/60711 A1 | 10/2000 |

* cited by examiner (a)

(b)
Ry=4.18

(a)

(b)

Ry=4.42

(a)

(b)

Ry=12.52

COMMUNICATION MODULE AND PORTABLE ELECTRONIC DEVICE

TECHNICAL FIELD

The present invention relates to a communication module and a portable electronic device including the same.

BACKGROUND ART

For example, an optical communication system for infrared communication disclosed in Patent Document 1 includes an optical transmission device having an LD chip sealed with a light scattering member and a light receiving element. The optical transmission device and the light receiving element are parallelly provided on a glass epoxy resin substrate, and collectively sealed with an epoxy resin mold lens.

The optical communication system according to Patent Document 1 reduces coherency of light by scattering a laser beam emitted from the LD chip a plurality of times with light scattering particles in the light scattering member. Thus, the system attempts to render the laser beam eye-safe.

PRIOR ART

Patent Document

Patent Document 1: Japanese Unexamined Patent Publication No. 2006-352105

SUMMARY OF THE INVENTION

Problems to be Solved by the Invention

An object of the present invention is to provide a communication module capable of preventing penetration of a noise beam into a light receiving element while being capable of rendering a laser beam eye-safe and a portable electronic device including the same, in relation to a communication module loaded with a laser element and a light receiving element on the same substrate.

Means for Solving the Problems

A communication module according to the present invention for attaining the aforementioned object includes a substrate, a laser element and a light receiving element provided on a front surface of the substrate and separating from each other, a transparent resin package collectively sealing the laser element and the light receiving element, and a diffusion unit provided to be opposed to a light emitting surface of the laser element at a prescribed distance for diffusing a laser beam emitted by the laser element, while the distance T between the laser element and the light receiving element satisfies the following formula (1):

$$T \geq t_1 \cdot \tan\theta + (t_1 + t_2) \cdot \tan\theta' \quad (1)$$

(in the formula (1), $t_1$ represents the distance between the light emitting surface of the laser element and the diffusion unit, $\theta$ represents the maximum angle of emission of the laser element, $t_2$ represents the difference between the height from the front surface of the substrate up to the light emitting surface and the height up to a light receiving surface of the light receiving element, and $\theta'$ represents the maximum diffusion angle of the diffusion unit.)

The communication module according to the present invention can diffuse the laser beam emitted from the laser element with the diffusion unit. Coherency of the laser beam can be reduced due to the diffusion, whereby the laser beam can be rendered eye-safe.

Further, the distance T satisfying the above formula (1) is provided between the laser element and the light receiving element. Even if a laser beam emitted from the laser element at the maximum angle of emission is reflected on the diffusion unit toward the substrate at the maximum diffusion angle, therefore, the reflected laser beam does not reach the light receiving surface of the light receiving element. Consequently, penetration of a noise beam into the light receiving element can be prevented.

In the above formula (1), the maximum diffusion angle $\theta'$ of the diffusion unit denotes the maximum diffusion angle of a laser beam emitted at the maximum angle $\theta$ of emission in laser beams emitted from the laser element.

The diffusion unit may include a diffuser having a diffusion surface and a non-diffusion surface on a side opposite to the diffusion surface, and in this case, the diffuser is preferably provided on the resin package in a posture directing the diffusion surface upward.

The orbit of light after reflection on the diffusion surface of the diffuser can be easily clarified on the basis of the distance between the light emitting surface of the laser element and the diffuser as well as the angle of emission of the laser beam and diffusion distribution of the diffuser etc. Thus, a region on the substrate on which the reflected laser beam is predicted to arrive can be easily set. Consequently, penetration of a noise beam into the light receiving element can be easily prevented by separating the light receiving element from the predicted arrival region of the reflected laser beam.

In preparation of this type of communication module, a separately prepared diffuser may simply be provided on the resin package, after collectively sealing the laser element and the light receiving element with the resin package. Therefore, a sealing step may be carried out only once, dissimilarly to a conventional technique carrying out two sealing steps including a step of sealing an LD chip with an optical scattering member and a step of further sealing the LD chip and a light receiving element with an epoxy resin mold lens. Consequently, manufacturing steps can also be simplified.

Preferably, the resin package includes a package body sealing the laser element and the light receiving element and having a front surface parallel to the front surface of the substrate, and a diffuser mounting base having a bottom wall and a sidewall in contact with the front surface of the package body and provided with a recess partitioned by the bottom wall and the sidewall for supporting the diffuser with the bottom wall in a posture directing the diffusion surface upward in the recess.

According to the structure, the distance between the light emitting surface of the laser element and the diffuser can be changed without changing the height of the package body, by adjusting the height of the diffuser mounting base (the distance between the front surface of the package body and the bottom surface of the recess). In other words, the distance between the light receiving surface of the light receiving element and the front surface of the package body is not lengthened by lengthening the distance between the light emitting surface of the laser element and the diffuser, and the distance between the light receiving surface of the light receiving element and the front surface of the package body is not shortened by shortening the distance between the light emitting surface of the laser element and the diffuser. Therefore, an orbit length of a laser beam incident upon the package body does not change due to a change of the height of the diffuser mounting base. Also in a case where the size of the substrate is limited and the upper limit of the distance T between the laser element and the light receiving element is limited, therefore, the predicted arrival region of the reflected laser beam can be changed without influencing light concentration characteristics of the light receiving element, by adjusting the height of the diffuser mounting base.

The sidewall of the diffuser mounting base may have an inclining surface inclining with respect to the bottom wall and facing the recess.

Preferably, the diffuser mounting base is provided in the form of a vessel so annularly formed in plan view that the sidewall surrounds the bottom wall.

The bottom wall of the diffuser mounting base is surrounded by the sidewall, whereby deviation in a direction parallel to the substrate can be eliminated, or the quantity of deviation in the direction can be reduced, when setting the diffuser on the bottom wall. Therefore, the position of the diffuser in the direction parallel to the substrate can be precisely controlled.

Preferably, the height of a top portion of the sidewall with respect to the bottom wall is larger than the height of the diffusion surface of the diffuser with respect to the bottom wall.

The height of the top portion of the sidewall is larger than the height of the diffusion surface, whereby fingers can be prevented from coming into contact with the diffusion surface when handling the substrate after setting the diffuser on the recess, for example. Consequently, lowering of eye-safe rendering resulting from leaving of fingerprints on the diffusion surface or the like can be prevented.

Preferably, the communication module further includes a protective sheet formed on the top portion of the sidewall to cover the recess.

Thus, the diffusion surface of the diffuser can be reliably protected.

The resin package may include a package body sealing the laser element and the light receiving element and having a front surface parallel to the front surface of the substrate, and a diffuser mounting recess for storing the diffuser may be formed on the front surface of the package body.

The communication module may further include an adhesive made of a material having the same refractive index as the refractive index of the resin package for fixing the non-diffusion surface of the diffuser to the resin package.

The diffusion unit may include a fine irregular portion formed by blasting a front surface of the resin package or transferring a mold subjected to electric discharge machining. Further, the diffusion unit may include an irregular portion formed by selectively satin-finishing a front surface of the resin package. Preferably in this case, the maximum height Ry (according to JIS B0601-1994) of the irregular portion is 4.0 μm to 13.0 μm. According to such a structure, the laser beam can be rendered eye-safe by performing simple working on the resin package.

A recess having a bottom surface opposed to the light emitting surface of the laser element may be formed on the resin package, and the diffusion unit may include a filler made of resin containing a light scattering agent for filling up the recess of the resin package.

Preferably, the resin package includes a convex lens provided to be opposed to the light receiving surface of the light receiving element at a prescribed distance for converging light on the light receiving surface. Thus, the light receiving element can excellently concentrate light.

The communication module may further include a transistor element provided on the front surface of the substrate. Preferably in this case, the transistor includes a transistor element constituting a driver for controlling emission of a laser beam from the laser element and/or a transistor element constituting a receiving amplifier for amplifying an electric signal of light incident upon the light receiving element.

Thus, the laser element and the driver therefor as well as the light receiving element and the receiving amplifier thereof can be gathered on one substrate, whereby downsizing of the module can be attained.

A portable electronic device according to the present invention includes the communication module according to the present invention and a device body loaded with the communication module.

The portable electronic device according to the present invention includes the communication module according to the present invention, whereby penetration of a noise beam into the light receiving element can be prevented in bidirectional communication, for example, while being capable of rendering the laser beam eye-safe. Consequently, a high-quality electronic device excellent in reliability can be provided.

BRIEF DESCRIPTION OF THE DRAWINGS

FIGS. 11(a) and 11(b) are diagrams for illustrating evaluation results of Example 2, while FIG. 11(a) shows a graph showing the relation between a light emission angle and light emission intensity of a laser and FIG. 11 (b) shows a photograph of a satin-finished surface respectively.

FIGS. 12(a) and 12(b) are diagrams for illustrating evaluation results of Example 3, while FIG. 12(a) shows a graph showing the relation between a light emission angle and light emission intensity of a laser and FIG. 12 (b) shows a photograph of a satin-finished surface respectively.

FIGS. 13(a) and 13(b) are diagrams for illustrating evaluation results of Example 4, while FIG. 13(a) shows a graph showing the relation between a light emission angle and light emission intensity of a laser and FIG. 13 (b) shows a photograph of a satin-finished surface respectively.

MODES FOR CARRYING OUT THE INVENTION

Embodiments of the present invention are now described in detail with reference to the attached drawings.

Figure 1:
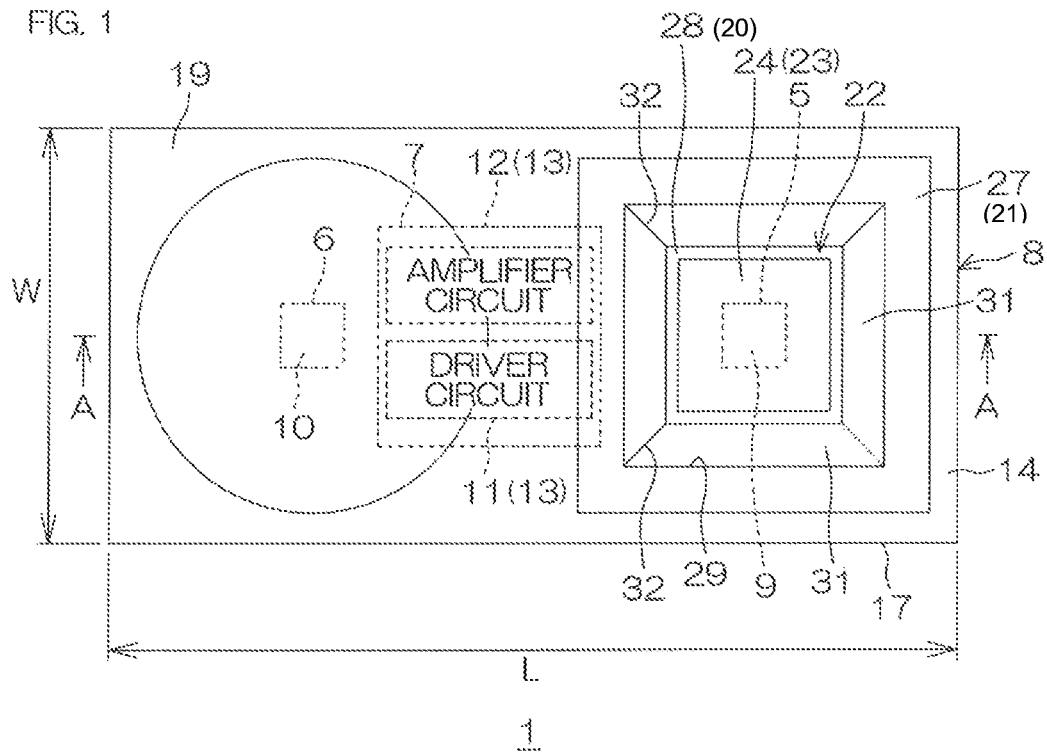
FIG. 1 A schematic plan view of a communication module according to a first embodiment of the present invention.
Figure 2:
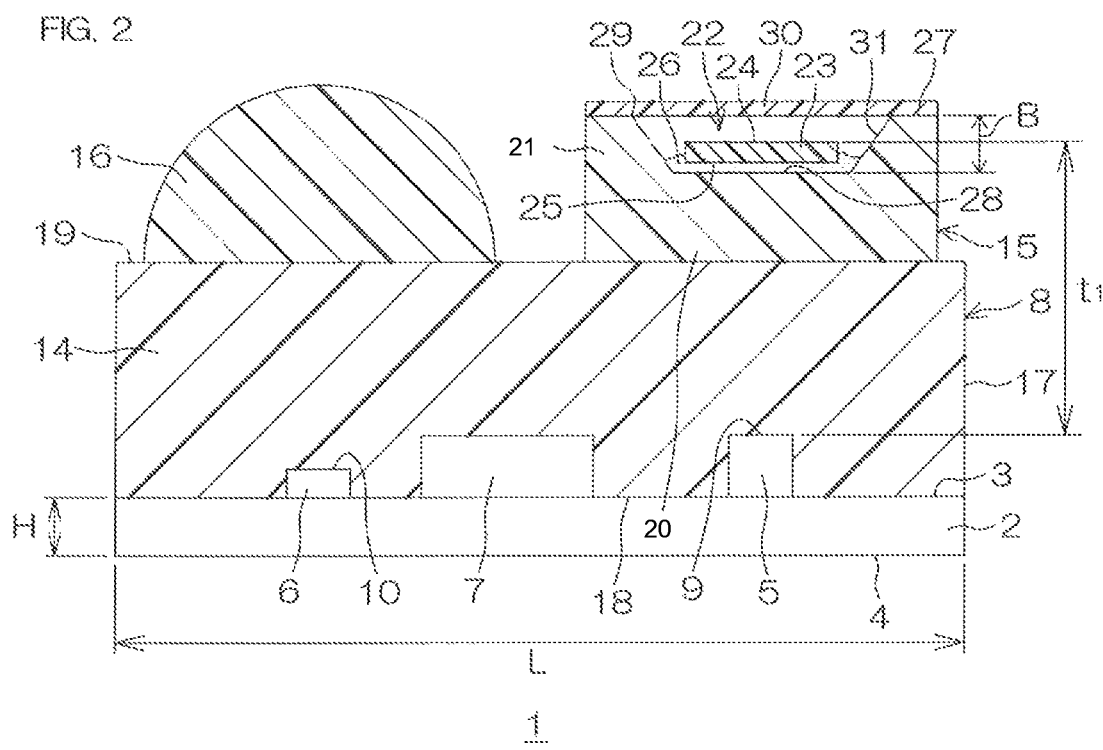
FIG. 2 A sectional view of the communication module shown in FIG. 1, showing a cutting plane along a cutting plane line A-A in FIG. 1.
Figure 3:
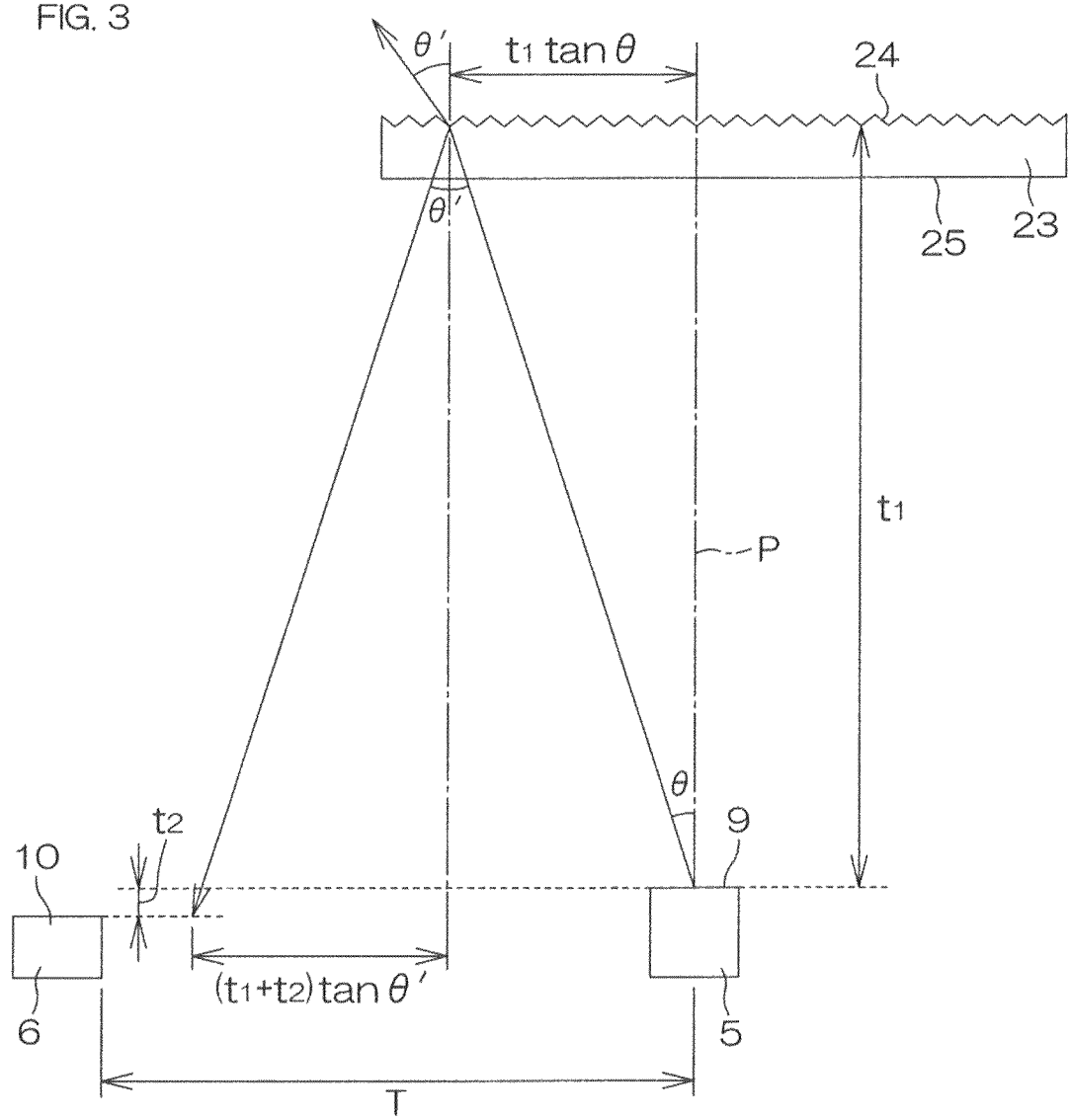
FIG. 3 A diagram for illustrating the positional relation between a laser diode, a photodiode and a diffuser shown in FIGS. 1 and 2.

FIG. 1 is a schematic plan view of a communication module according to a first embodiment of the present invention. FIG. 2 is a sectional view of the communication module shown in FIG. 1, and shows a cutting plane along a cutting plane line A-A in FIG. 1. FIG. 3 is a diagram for illustrating the positional relation between a laser diode, a photodiode and a diffuser shown in FIGS. 1 and 2.

According to the embodiment, a communication module 1 is a module for making bidirectional communication by utilizing near infrared rays (infrared rays in the wave range of 830 nm to 900 nm, for example). The communication module 1 includes a substrate 2 having a front surface 3 and a rear surface 4, a laser diode 5 (LD), a photodiode 6 (PD) as a light receiving element and an integrated circuit 7 provided on the front surface 3 of the substrate 2, and a resin package 8 sealing the side of the front surface 3 of the substrate 2.

The substrate 2 is made of glass epoxy resin in the form of a rectangular plate having a length L of 8.5 mm (the length of the long sides in plan view), a width W of 2 mm (the length of the short sides in plan view) and a height H of 3.5 mm, for example. However, the size of and the material for the substrate 2 are not restricted to the aforementioned ones.

The laser diode 5, the photodiode 6 and the integrated circuit 7 are provided in the form of chips. The chip-shaped laser diode 5, the photodiode 6 and the integrated circuit 7 are arranged along the longitudinal direction of the substrate 2 (a direction along the long sides in plan view) at intervals from one another. The integrated circuit 7 is arranged on a central portion in the longitudinal direction of the substrate 7, while the laser diode 5 is arranged on one side thereof, and the photodiode 6 is arranged on a side of the integrated circuit 7 opposite to the laser diode 5. The integrated circuit 7 is held between the laser diode 5 and the photodiode 6.

The laser diode 5 is a surface emission laser having a light emitting surface 9 whose light source diameter (the diameter of an opening from which a laser is emitted) is about 10 µm, for example. The laser diode 5 is so provided that the light emitting surface 9 is directed vertically upward with respect to the front surface 3 of the substrate 2. The laser diode 5 lases from the light emitting surface 9 toward a portion above the substrate 2 at a lasing wavelength in the near-infrared wave range (about 850 nm, for example).

The photodiode 6 has a light receiving surface 10 whose light receiving diameter (the diameter of an opening in which light is converged) is 100 µm to 400 µm, for example. The photodiode 6 is so provided that the light receiving surface 10 is directed vertically upward with respect to the front surface 3 of the substrate 2. The photodiode 6 converts light introduced from above the substrate 2 toward the front surface 3 and converged on the light receiving surface 10 to current (optical current).

The integrated circuit 7 includes a driver circuit 11 for controlling emission of a laser beam from the laser diode 5, a receiving amplifier circuit 12 for amplifying a signal of the optical current generated in the photodiode 6 and the like. The circuits 11 and 12 are constituted of transistor elements 13.

The resin package 8 is made of resin transparent with respect to the lasing wavelength (in the near infrared wave range) of the laser diode 5, and more specifically, made of epoxy resin or the like. The refractive index $n_1$ of the resin package 8 is 1.52, for example.

The resin package 8 includes a package body 14, a diffuser mounting base 15, and a convex lens 16.

The package body 14 is in the form of a rectangular parallelepiped having side surfaces 17 flush with the respective ones of four side surfaces of the substrate 2 in the form of a rectangular plate, a rear surface 18 in contact with the front surface 3 of the substrate 2 and a front surface 19 parallel to the front surface 3 of the substrate 2. The package body 14 is fixed to the front surface 3 of the substrate 2, to cover the whole of the laser diode 5, the photodiode 6 and the integrated circuit 7.

The diffuser mounting base 15 and the convex lens 16 are arranged on the front surface 19 of the package body 14 at an interval from each other along the longitudinal direction of the package body 14, and integrally supported by the package body 14. The diffuser mounting base 15 is arranged to be opposed to the light emitting surface 9 of the laser diode 5, and the convex lens 16 is arranged to be opposed to the light receiving surface 10 of the light receiving element.

The diffuser mounting base 15 has a contour square in plan view. The diffuser mounting base 15 has a bottom wall 20 and a sidewall 21 in the form of a quadrangular ring in plan view surrounding the bottom wall 20, and is provided in the form of such a vessel that a recess 22 is formed on a portion surrounded by the bottom wall 20 and the sidewall 21. The vessel-shaped diffuser mounting base 15 is so provided that the sidewall 21 surrounds the laser diode 5 in plan view, and the recess 22 partitioned by the bottom wall 20 and the sidewall 21 covers the whole of the light emitting surface 9 of the laser diode 5 in plan view.

A diffuser 23 as a diffusion unit for diffusing the laser beam emitted by the laser diode 5 is provided on the recess 22.

The diffuser 23 is provided in the form of a square plate having a diffusion surface 24 (a front surface) and a non-diffusion surface 25 (a rear surface) on a side opposite to the diffusion surface 24, and fixed to the bottom wall 20 of the diffuser mounting base 15 in a posture directing the diffusion surface 24 upward. In other words, the non-diffusion surface 25 of the diffuser 23 is fixed to the bottom wall 20 of the diffuser mounting base 15.

Irregularities in the form of triangular prisms, for example, are formed on the diffusion surface 24 of the diffuser 23 in a striped manner, as shown in FIG. 3. The laser beam emitted from the laser diode 5 and incident upon the diffuser 23 at a prescribed angle is diffused by the diffusion surface 24 in the form of triangular prisms at a prescribed angle of emission. The diffusion surface 24 may be in the form of semicolumnar prisms or semielliptical prisms, for example, so far as the same can diffuse the laser beam at a desired angle.

An adhesive 26 made of a material (an epoxy-based adhesive or the like, for example) having the same refractive index $n_2$ as the refractive index $n_1$ of the resin package 8, for example, is employed for the fixation of the diffuser 23 and the diffuser mounting base 15.

A step B is provided between the diffusion surface 24 of the diffuser 23 fixed by the adhesive 26 and top surfaces 27 of the sidewall 21 of the diffuser mounting base 15. The height of the top surfaces 27 of the sidewall 21 with respect to the bottom wall 20 of the diffuser mounting base 15 (a bottom surface 28 of the recess) is set larger than the height of the diffusion surface 24 with respect to the bottom surface 28 of the recess 22, to result in the step B.

A protective sheet 30 partitioned by the sidewall 21 in the form of a quadrangular ring in plan view for blocking an open surface 29 of the recess 22 flush with the top surfaces 27 of the sidewall 21 is mounted on the top surfaces 27 of the sidewall 21 of the diffuser mounting base 15 (not shown in FIG. 1). The protective sheet 30 is made of resin transparent with respect to the lasing wavelength (in the near infrared wave range) of the laser diode 5.

A surface of the sidewall 21 of the diffuser mounting base 15 facing the recess 22 is formed by four planes each sharing one side with each of the four top surfaces 27 forming four sides of the sidewall 21 in plan view. The four planes are formed as such inclining surfaces 31 (tapering surfaces) that the distance between two planes opposed to each other narrows toward the bottom wall 20. Ridgelines 32 extending on four corners of the sidewall 21 are formed between adjacent inclining surfaces 31.

Each inclining surface 31 inclines at about 85°, for example, with respect to the bottom surface 28 of the diffuser mounting base 15.

The convex lens 16 is provided in the form of a hemisphere projecting from the front surface 19 of the package body 14. The height of the convex lens 16 (the diameter of the convex lens 16) with respect to the front surface 19 of the package body 14 is greater than the height of the top surfaces 27 of the sidewall 21 of the diffuser mounting base 15 with respect to the front surface 19 of the package body 14, for example.

As hereinabove described, the laser diode 5 and the photodiode 6 are provided along the longitudinal direction of the substrate 2 to separate from each other, and the diffuser 23 is so supported by the diffuser mounting base 15 as to be arranged immediately above the laser diode 5.

According to the embodiment, the distance T between the laser diode 5 and the photodiode 6 satisfies the following formula (1), as shown in FIG. 3:

$$T \geq t_1 \cdot \tan \theta + (t_1 + t_2) \cdot \tan \theta' \quad (1)$$

In the formula (1), the variable $t_1$ represents the vertical distance (the length of a perpendicular P lowered from an arbitrary point of the diffusion surface 24 to the light emitting surface 9) between the light emitting surface 9 of the laser diode 5 and the diffusion surface 24 of the diffuser 23.

The variable θ represents the maximum angle of emission of the laser diode 5 (the maximum one among included angles between the perpendicular P and the orbit of the laser beam before diffusion), and is 10° to 30°, for example.

The variable $t_2$ represents the difference between the height from the front surface 3 of the substrate 2 up to the light emitting surface 9 and the height up to the light receiving surface 10 of the photodiode 6, and is 0 mm, for example (in other words, the height of the laser diode 5 and the height of the photodiode 6 are identical to each other).

The variable θ' represents the maximum diffusion angle of the diffuser 23 (the maximum one among included angles between the perpendicular P and the orbit of the laser beam after the diffusion emitted at the maximum angle θ of emission), and is 10° to 35°, for example.

In the communication module 1, as hereinabove described, the laser beam emitted from the light emitting surface 9 of the laser diode 5 is incident upon the diffuser 23 through the non-diffusion surface 25 of the diffuser 23, and diffused by the diffusion surface 24 in the form of prisms, as shown in FIG. 3. Thus, a virtual light source diameter of the laser beam immediately after passing through the diffusion surface 24 can be enlarged. Consequently, coherency of the laser beam recognized by human eyes can be reduced, for example, whereby the laser beam can be rendered eye-safe.

While the emitted laser beam is refracted also in the diffuser 2, the diffuser 23 is so thin that influence by the refraction can be ignored.

At this time, part of the laser beam incident upon the diffuser 23 is not diffused in a direction separating from the substrate 2, but reflected by the diffusion surface 24 toward the front surface 3 of the substrate 2. Therefore, there is a possibility that the reflected laser beam turns into a noise beam incident upon the light receiving surface 10 of the photodiode 6, although the same is irrelevant to the light converged on the photodiode 6.

According to the embodiment, therefore, it is noted that the angle of reflection of the reflected laser beam is the same angle as the diffusion angle of the laser beam incident upon the diffuser 23 in the same orbit as the reflected laser beam and diffused from the diffusion surface 24 after the incidence, and the distance T satisfying the above formula (1) is provided between the laser diode 5 and the photodiode 6.

Even if the laser beam emitted from the laser diode 5 at the maximum angle θ of emission is reflected on the diffusion surface 24 of the diffuser 23 toward the substrate 2 at the same angle θ' of reflection as the maximum diffusion angle θ' as shown in FIG. 3, therefore, the reflected laser beam does not reach the light receiving surface 10 of the photodiode 6. Consequently, penetration of a noise beam into the photodiode 6 can be prevented.

As in the above formula (1), a predicted arrival region of the reflected laser beam around the laser diode 5 (a region within a radius $t_1 \cdot \tan \theta + (t_1 + t_2) \cdot \tan \theta'$ centering on the laser diode 5) can be easily clarified on the basis of the vertical distance $t_1$ between the light emitting surface 9 of the laser diode 5 and the diffusion surface 24 of the diffuser 23, the maximum angle θ of emission of the laser diode 5, the difference $t_2$ between the height from the front surface 3 of the substrate 2 up to the light emitting surface 9 and the height up to the light receiving surface 10 of the photodiode 6, and the maximum diffusion angle θ' of the diffuser 23. Thus, the predicted arrival region of the reflected laser beam can be easily set. Consequently, penetration of a noise beam into the photodiode 6 can be easily prevented by separating the photodiode 6 from the predicted arrival region of the reflected laser beam.

In preparation of this type of communication module 1, the separately prepared diffuser 23 may simply be provided on the resin package 8 (the diffuser mounting base 15), after collectively sealing the laser diode 5, the photodiode 6 and the integrated circuit 7 with the resin package 8. Therefore, a sealing step may be carried out only once, dissimilarly to a conventional technique carrying out two sealing steps including a step of sealing an LD chip with an optical scattering member and a step of further sealing the LD chip and a light receiving element with an epoxy resin mold lens. Consequently, manufacturing steps can also be simplified.

Further, the laser diode 5, the photodiode 6 and the integrated circuit 7 can be gathered on one substrate 2, whereby downsizing of the communication module 1 can be attained.

In the communication module 1, the diffuser 23 is provided on the diffuser mounting base 15, whereby the distance between the light emitting surface 9 of the laser diode 5 and the diffusion surface 24 of the diffuser 23 can be changed without changing the height of the package body 14, by adjusting the thickness of the bottom wall 20 of the diffuser mounting base 15 (the distance between the front surface 19 of the package body 14 and the bottom surface 28 of the recess 22). In other words, the distance between the light receiving surface 10 of the photodiode 6 and the front surface 19 of the package body 14 is not lengthened by lengthening the distance between the light emitting surface 9 of the laser diode 5 and the diffusion surface 24 of the diffuser 24, and the distance between the light receiving surface 10 of the photodiode 6 and the front surface 19 of the package body 14 is not shortened by shortening the distance between the light emitting surface 9 of the laser diode 5 and the diffusion surface 24 of the diffuser 23. Therefore, an orbit length of light incident upon the package body 14 does not change due to a change of the thickness of the bottom wall 20 of the diffuser mounting base 15. Also in a case where the size of the substrate 2 is limited and the upper limit of the distance T between the laser diode 5 and the photodiode 6 is restricted, therefore, the predicted arrival region of the reflected laser beam can be changed without influencing light concentration characteristics of the photodiode 6, by adjusting the thickness of the bottom wall 20 of the diffuser mounting base 15. According to the embodiment, further, the convex lens 16 is integrally formed on the package body 14, whereby the photodiode 6 can excellently concentrate light.

Further, the bottom wall 20 of the diffuser mounting base 15 is surrounded by the sidewall 21, whereby deviation in a direction parallel to the front surface 3 of the substrate 2 can be eliminated, or the quantity of deviation in the direction can be reduced, when setting the diffuser 23 on the bottom wall 20. Therefore, the position of the diffuser 23 in the direction parallel to the front surface 3 of the substrate 2 can be precisely controlled.

In addition, the height of the top surfaces 27 of the sidewall 21 with respect to the bottom wall 20 of the diffuser mounting base 15 (the bottom surface 28 of the recess) is larger than the height of the diffusion surface 24 with respect to the bottom surface 28 of the recess 22, whereby fingers can be prevented from coming into contact with the diffusion surface 24 when handling the substrate 2 after setting the diffuser 23 on the recess 22, for example. Consequently, lowering of eye-safe rendering resulting from leaving of fingerprints on the diffusion surface 24 or the like can be prevented. Further, the protective sheet 30 is so provided as to block the open surface 29 of the recess 22, whereby the diffusion surface 24 of the diffuser 23 can be reliably protected with the protective sheet 30.

While the first embodiment of the present invention has been described, the present invention can be embodied in other ways.

Figure 4:
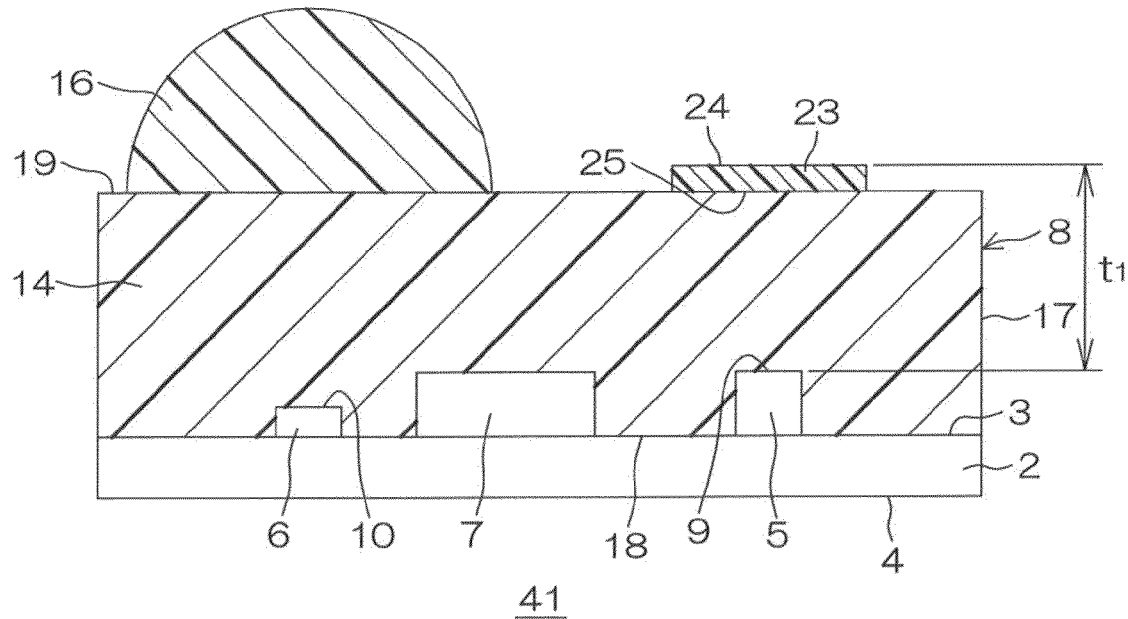
FIG. 4 A sectional view of a communication module according to a second embodiment of the present invention, showing a cutting plane on the same position as the cutting plane of FIG. 2.

As in a communication module 41 according to a second embodiment shown in FIG. 4, for example, a diffuser 23 may be directly set on a portion of a front surface 19 of a package body 14 opposed to a laser diode 5. In this case, the aforementioned adhesive 26 may be employed.

Figure 5:
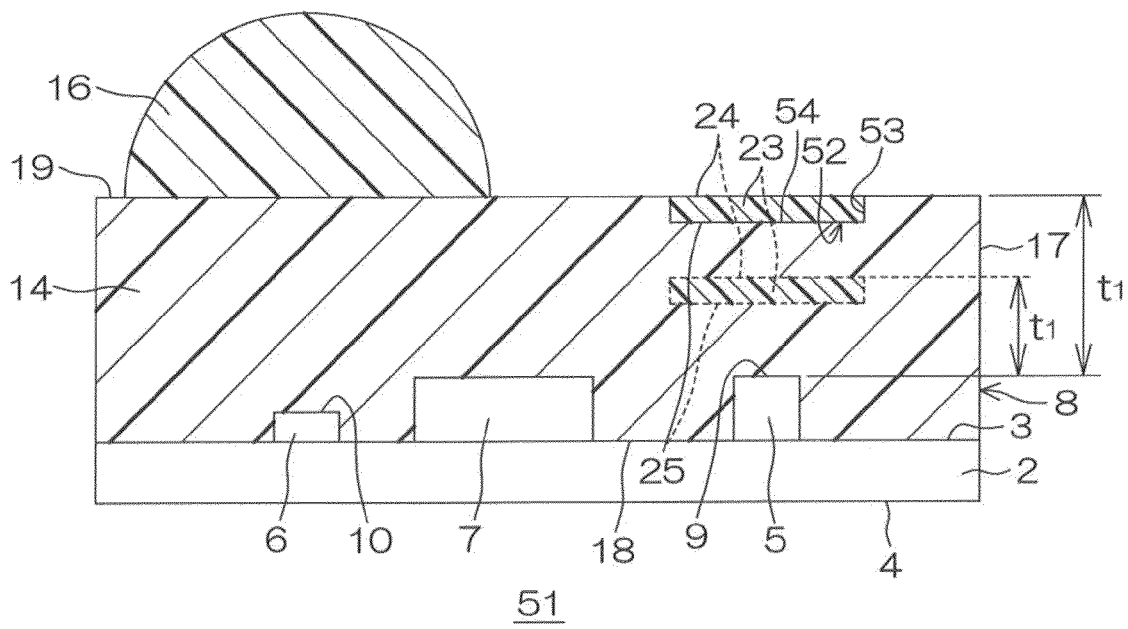
FIG. 5 A sectional view of a communication module according to a third embodiment of the present invention, showing a cutting plane on the same position as the cutting plane of FIG. 2.

As in a communication module 51 according to a third embodiment shown in FIG. 5, a diffuser mounting recess 52 partitioned by side surfaces 53 identical in shape to side surfaces of a diffuser 23 and a bottom surface 54 identical in shape to a non-diffusion surface 25 may be so formed on a front surface 19 of a package body 14 that the diffuser 23 is fitted into the diffuser mounting recess 52. Alternatively, the diffuser 23 may be embedded in an intermediate portion in the height direction of the package body 14, as shown by broken lines in FIG. 5.

Figure 6:
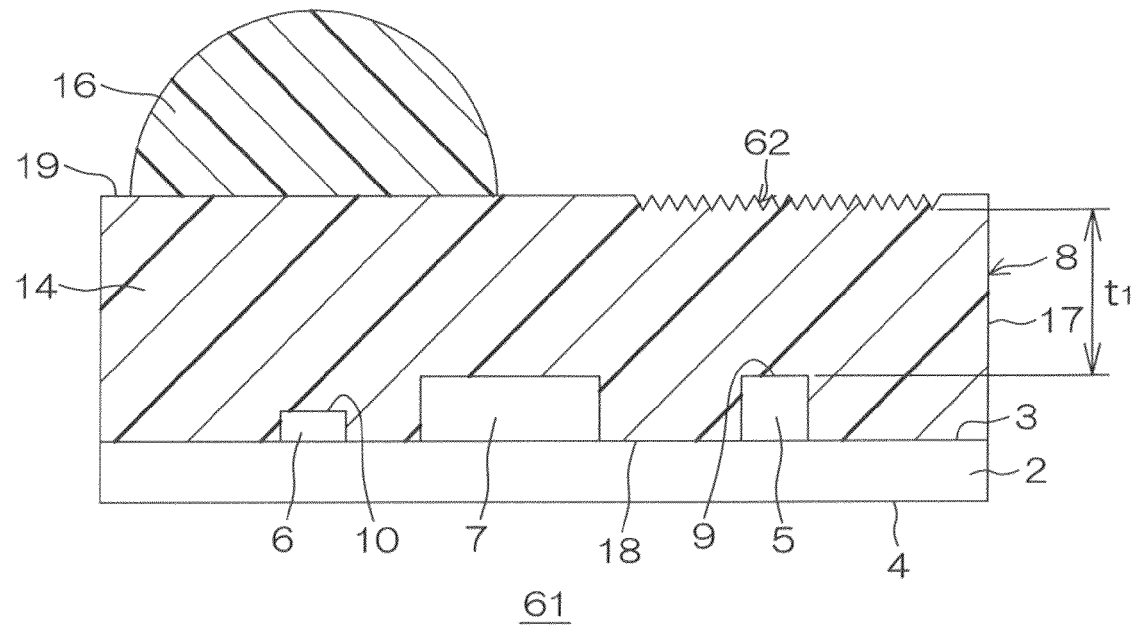
FIG. 6 A sectional view of a communication module according to a fourth embodiment of the present invention, showing a cutting plane on the same position as the cutting plane of FIG. 2.

As in a communication module 61 according to a fourth embodiment shown in FIG. 6, a fine irregular portion 62 may be formed by transferring a mold subjected to blasting such as sandblasting or electric discharge machining selectively to a portion of a front surface 19 of a package body 14 opposed to a laser diode 5, so that the fine irregular portion 62 can substitute for the diffusion surface 24 of the diffuser 23.

The fine irregular portion 62 may be an irregular portion satin-finished by transferring a mold subjected to satin finishing selectively to the portion of the front surface 19 of the package body 14 opposed to the laser diode 5 (more specifically, by integrally molding the package body 14 and a convex lens 16 with a mold selectively subjected to satin finishing (provided with a satin-finished surface)). In this case, the maximum height Ry (according to JIS B0601-1994) of the irregular portion is preferably 4.0 µm to 13.0 µm.

Figure 7:
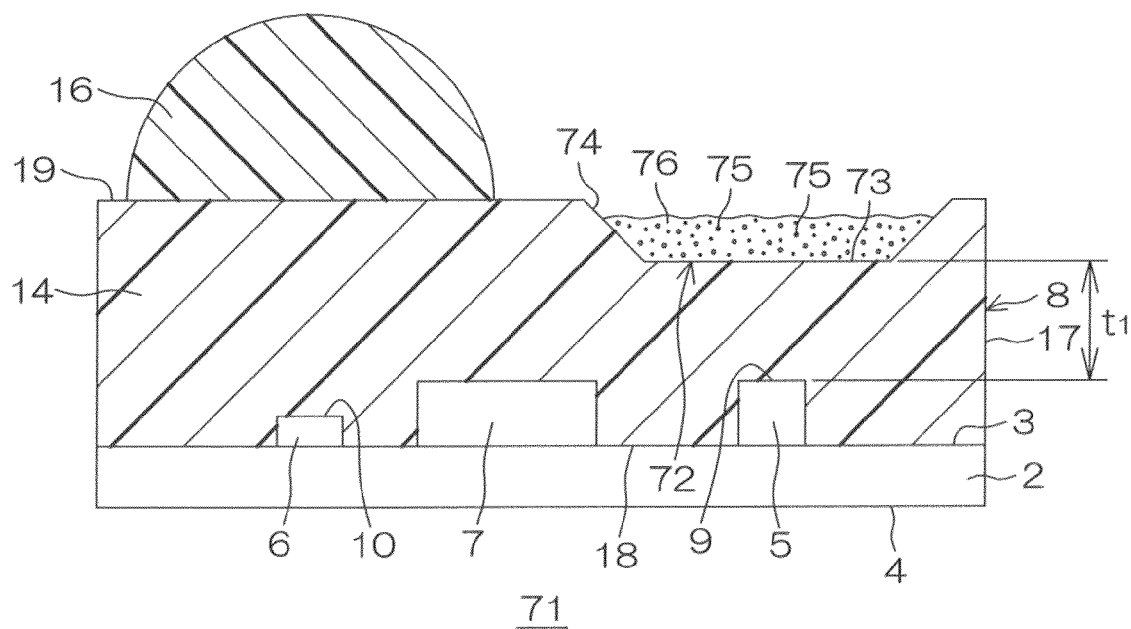
FIG. 7 A sectional view of a communication module according to a fifth embodiment of the present invention, showing a cutting plane on the same position as the cutting plane of FIG. 2.

As in a communication module 71 according to a fifth embodiment shown in FIG. 7, a recess 72 partitioned by a bottom surface 73 opposed to a light emitting surface 9 of a laser diode 5 and inclining surfaces 74 inclining with respect to the bottom surface 73 may be formed on a front surface 19 of a package body 14 and resin containing a light scatterer 75 may be charged into the recess 72, so that a filler 76 substitutes for the diffuser 23.

Figure 8:
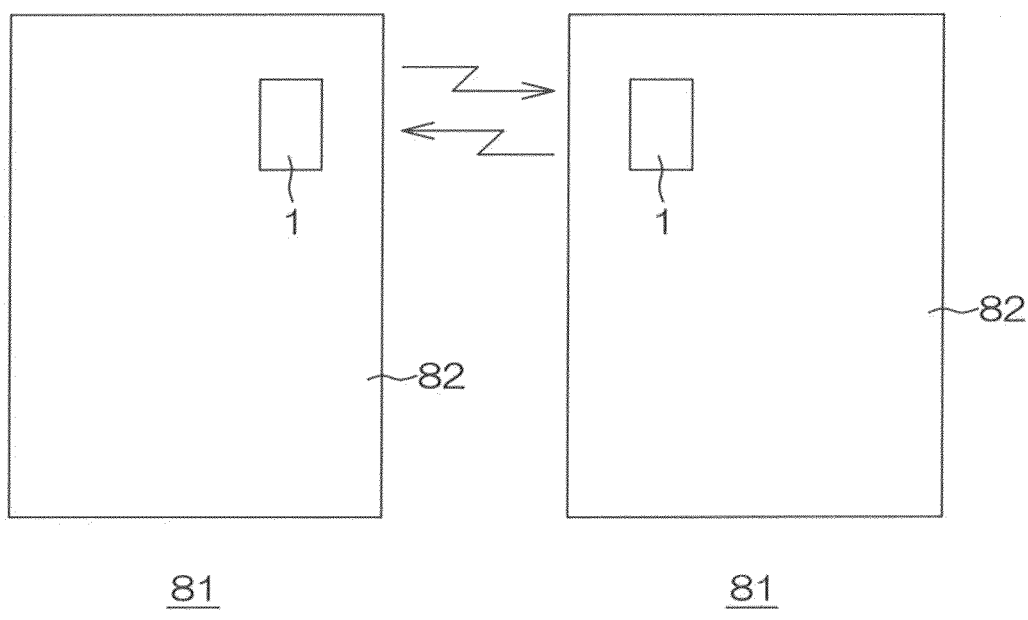
FIG. 8 A schematic block diagram of a portable electronic device according to one embodiment of the present invention.

The aforementioned communication module 1 can be loaded on a device body 82 of a portable electronic device 81 such as a portable telephone or a portable gaming machine, as shown in FIG. 8, for example.

Such a portable electronic device 81 is so loaded with the aforementioned communication module 1 that the same can prevent penetration of a noise beam into the photodiode 6 in bidirectional communication (such communication that laser emission from the laser diode 5 and photoreception on the photodiode 6 are simultaneously performed), for example, while being capable of rendering the laser beam eye-safe. Consequently, a high-quality electronic device excellent in reliability can be provided. The communication module 41, 51, 61 or 71 can also be loaded on the portable electronic device 81, in place of the communication module 1.

The communication module according to the present invention is applicable not only to a module handling the near infrared wave range, but also to a module handling another wave range.

The embodiments of the present invention are mere specific examples employed for clarifying the technical contents of the present invention, the present invention is not to be interpreted limitedly to the specific examples, and the spirit and scope of the present invention are to be limited only by the appended claims.

The elements shown in the respective embodiments of the present invention can be combined with one another in the range of the present invention.

This application corresponds to Japanese Patent Application No. 2011-040615 filed with the Japan Patent Office on Feb. 25, 2011, the disclosure of which is incorporated herein by reference.

EXAMPLES

While the present invention is now described on the basis of Examples, the present invention is not restricted to the following Examples.

Example 1 and Comparative Example 1

A communication module having the structure shown in FIGS. 1 to 3 was prepared as Example 1. Respective variables in the following formula (1) were set as follows:

$$T \geq t_1 \cdot \tan \theta + (t_1 + t_2) \cdot \tan \theta' \quad (1)$$

Figure 9:
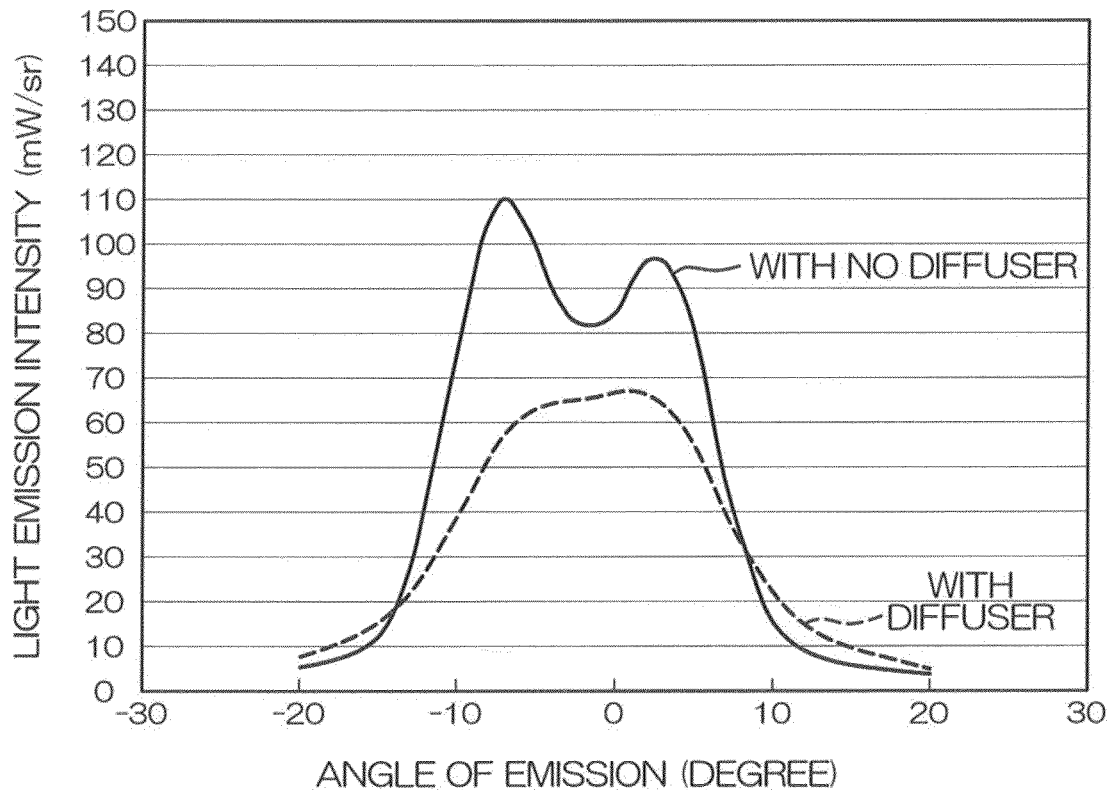
FIG. 9 A graph for illustrating an effect of rendering a laser beam eye-safe with a diffuser.

$t_1 = 2.93$ mm, $\theta = \pm 10°$, $t_2 = 0$ mm, $\theta' = \pm 10°$, $t_1 \cdot \tan \theta = 0.45$ mm, $\tan \theta' = 0.45$ mm $T = 0.9$ mm <Evaluation>
(1) Effect of Rendering Laser Beam Eye-Safe A laser diode of the aforementioned communication module was made to lase at a lasing wavelength of 850 nm, and light emission intensity with respect to the angle of emission of the laser beam at that time was measured. As comparative example 1, light emission intensity was measured by a similar method in relation to a module having the same structure as the communication module according to Example 1 except that no diffuser was set. FIG. 9 shows the results.

According to FIG. 9, two peaks of the light emission intensity of the laser beam were present (multi-peak) in the communication module according to comparative example 1 in which no diffuser was set. Also when controlling one of the peaks to light emission intensity of less than 99 mW/sr which is an index of eye-safe rendering, therefore, there was a possibility that the other peak exceeded 99 mW/sr, and it has been understood difficult to control both peaks to less than 99 mW/sr.

In the communication module according to Example 1 in which the diffuser was set, on the other hand, the light emission intensity of the laser beam had one peak (single-peak), and hence it has been understood possible to easily control the light emission intensity low to be less than 99 mW/sr. Consequently, it has been understood possible to stably implement eye-safe rendering in the communication module according to the present invention.

(2) Effect of Preventing Penetration of Noise Beam

Figure 10:
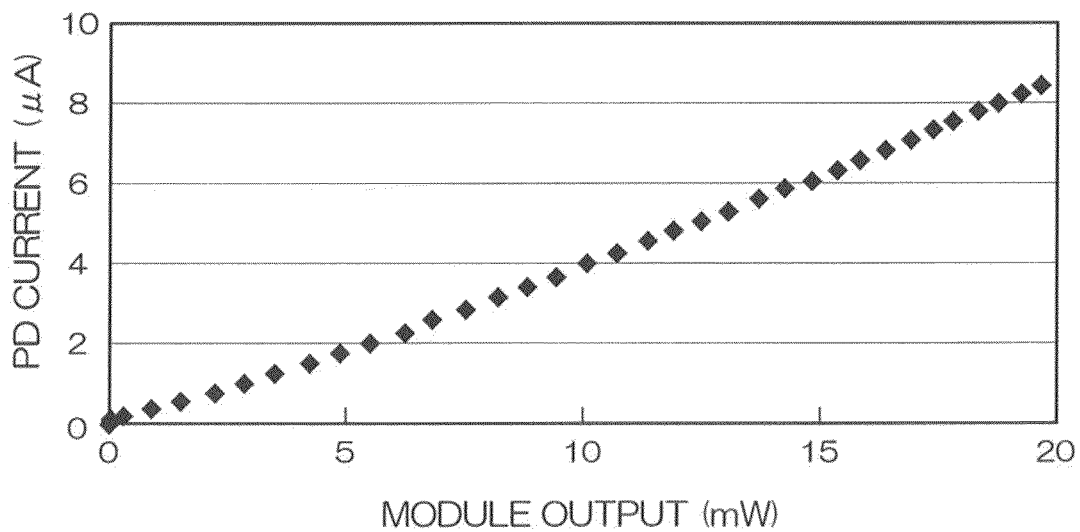
FIG. 10 A graph for illustrating an effect of preventing penetration of a noise beam into a photodiode.
Figure 11:
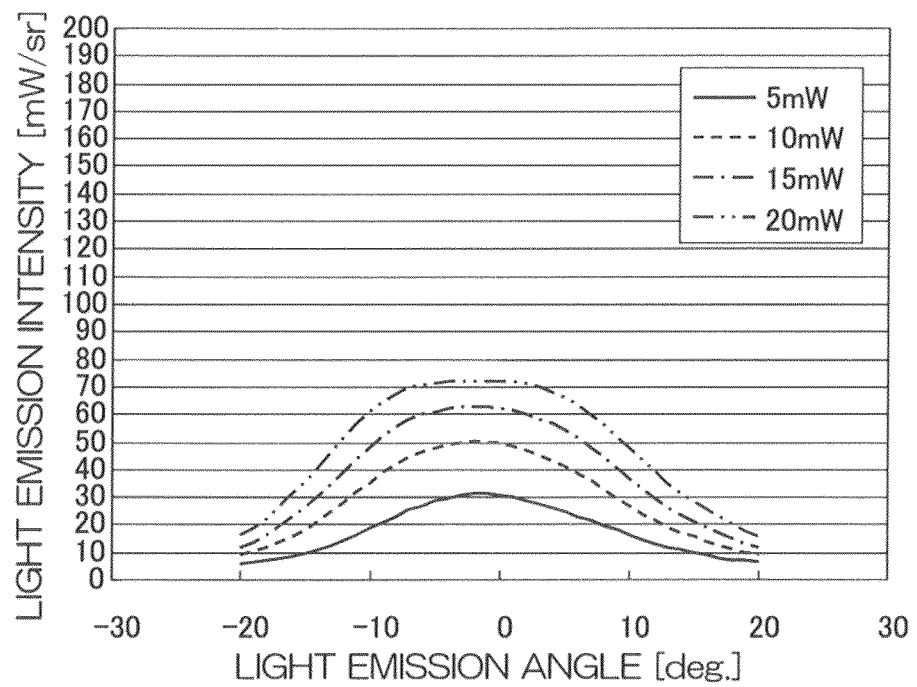
Figure 11:
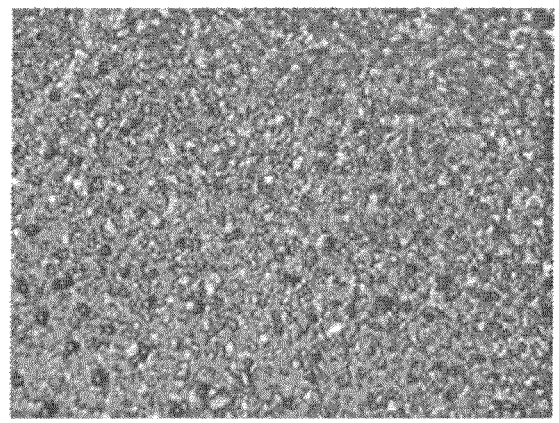
Figure 12:
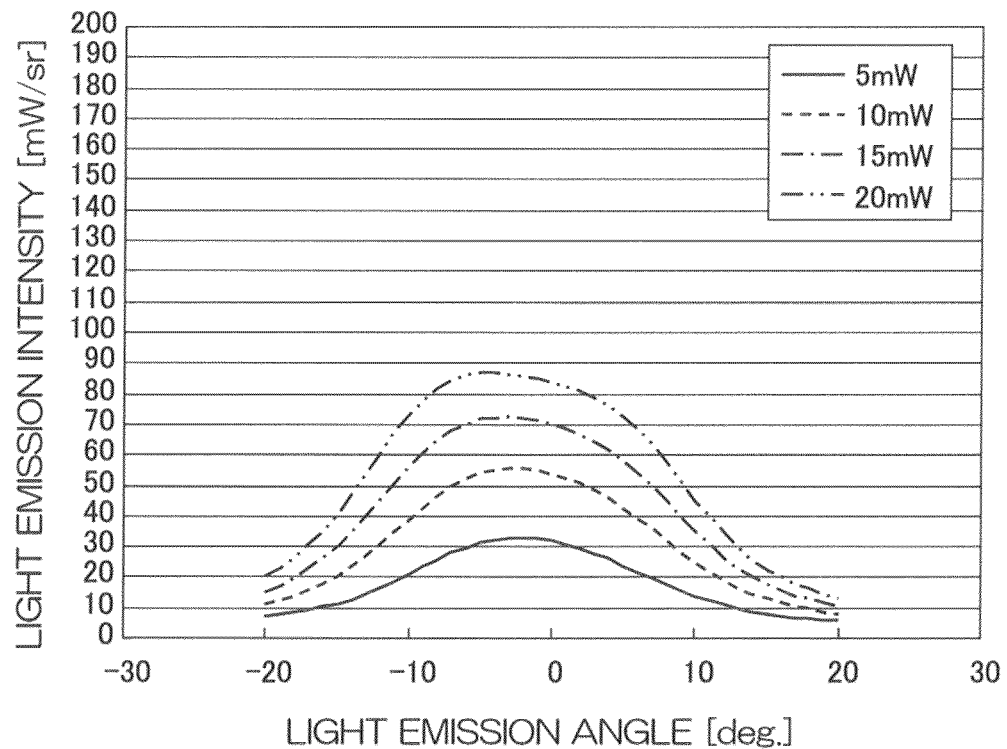
Figure 12:
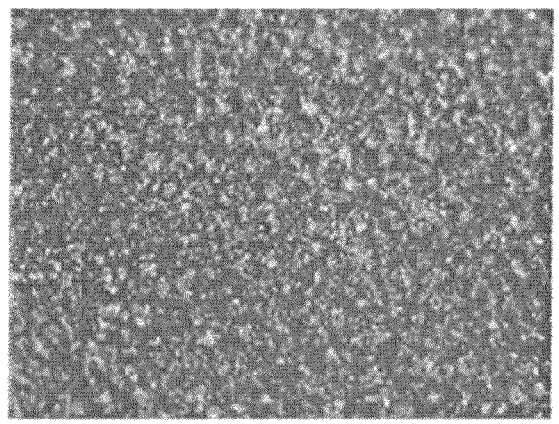
Figure 13:
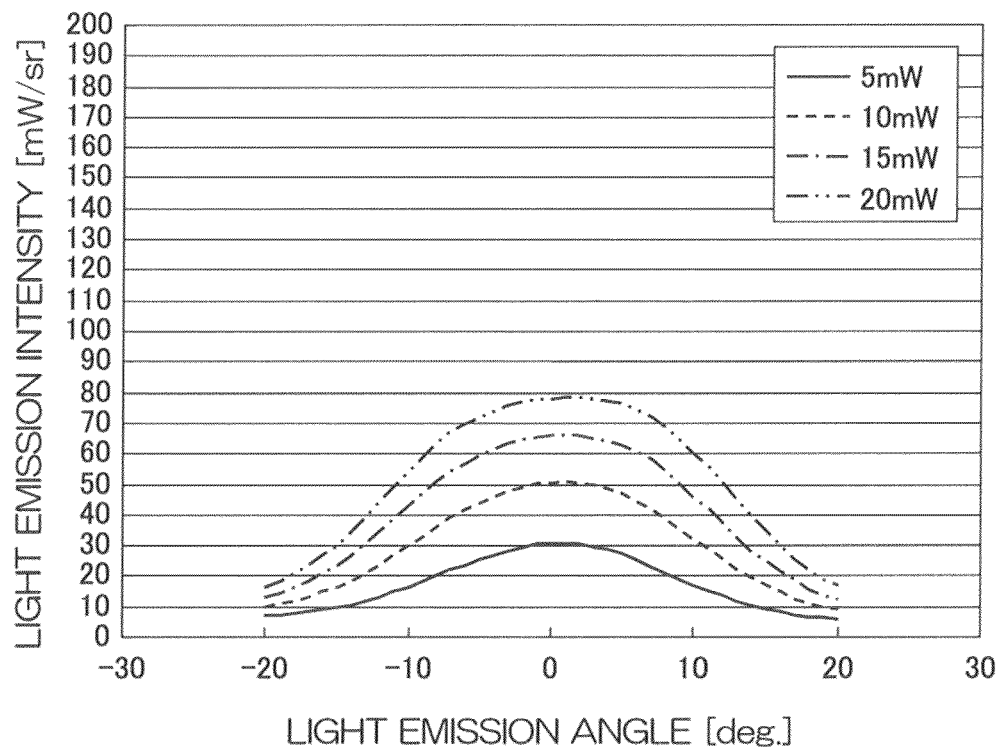
Figure 13:
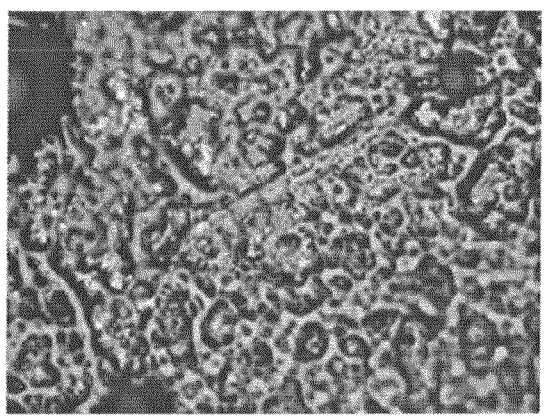

The aforementioned communication module was prepared, and the laser diode of the module was made to lase at a lasing wavelength of 850 nm. Whether or not the magnitude of current (PD current) flowing through a photodiode of the module at this time was influenced by output (module output) of the laser diode of the module was evaluated. FIG. 10 shows the results.

While PD current increased in proportion to the module output according to FIG. 10, it has been understood that the quantity of the laser beam emitted from the laser diode to penetrate as a noise beam was sufficiently small with respect to the module output.

Examples 2 to 4 and Comparative Example 2

Communication modules each having the structure shown in FIG. 6 were prepared as Examples 2 to 4.

Portions of front surfaces 19 of package bodies 14 opposed to laser diodes 5 were satin-finished. The maximum heights Ry of irregular portions formed by the satin finishing were 4.18 μm (Example 2), 4.42 μm (Example 3) and 12.52 μm (Example 4) respectively. Respective variables in the following formula (1) were set as follows:

$$T \geq t_1 \cdot \tan\theta + (t_1 + t_2) \cdot \tan\theta' \quad (1)$$

$t_1$=2.93 mm, θ=±10°, $t_2$=0 mm, θ'=±10°, $t_1$·tan θ=0.45 mm, tan θ'=0.45 mm

T=0.9 mm

Similarly, modules having the same structures as the communication modules according to Examples 2 to 4 except that portions corresponding to those having the satin-finished surfaces according to Examples 2 to 4 were not satin-finished (formed as smooth surfaces) were prepared as comparative example 2.

<Evaluation>
(1) Effect of Rendering Laser Beam Eye-Safe

Laser diodes of the communication modules according to Examples 2 to 4 and comparative example 2 were made to lase at a lasing wavelength of 850 nm (with power of 5 mW, 10 mW, 15 mW and 20 mW), and light emission intensity levels with respect to angles of emission of laser beams at that time were measured. FIGS. 11 to 14 show the results respectively.

Figure 14:
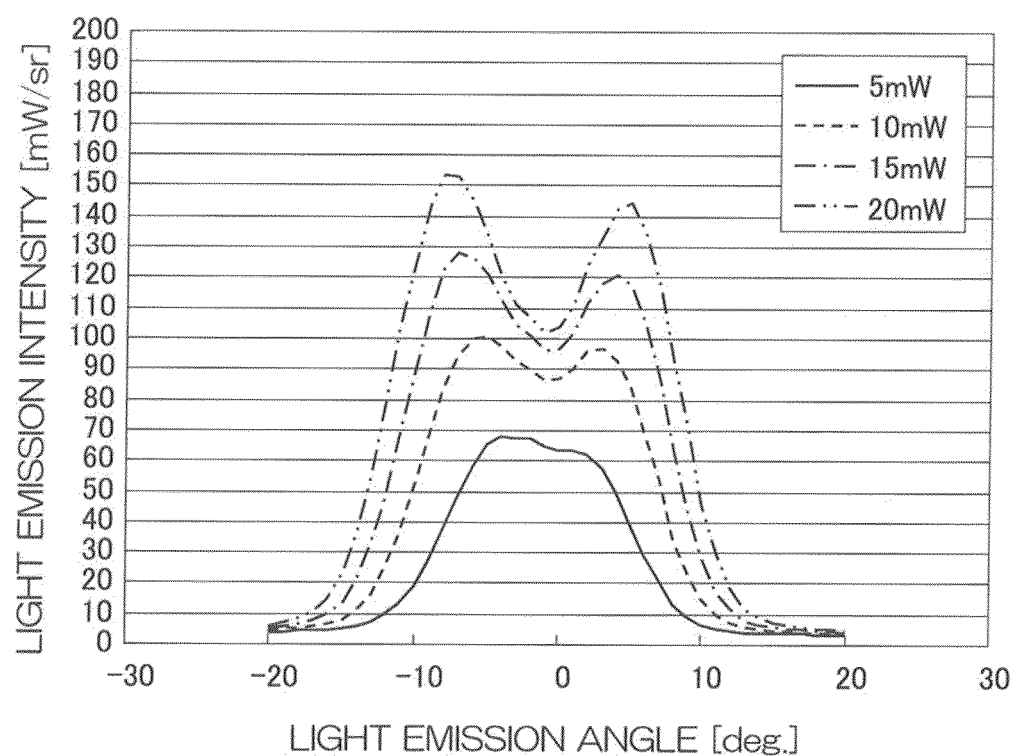
FIG. 14 is a graph showing the relation between a light emission angle and light emission intensity of a laser according to comparative example 2.

According to FIG. 14, two peaks of the light emission intensity of the laser beam were present (multi-peak) in each of the communication modules according to comparative example 2 whose package surfaces were not satin-finished. Also when controlling one of the peaks to light emission intensity of less than 99 mW/sr which is an index of eye-safe rendering, therefore, there was a possibility that the other peak exceeded 99 mW/sr, and it has been understood difficult to control both peaks to less than 99 mW/sr. Particularly at the energy levels of 15 mW and 20 mW, all peaks were in excess of 99 mW/sr.

In each of the communication modules according to Examples 2 to 4 whose package surfaces were satin-finished, on the other hand, the light emission intensity of the laser beam had one peak (single-peak), and hence it has been understood possible to easily control the light emission intensity low to be less than 99 mW/sr. Consequently, it has been understood possible to stably implement eye-safe rendering in the communication module according to the present invention.

DESCRIPTION OF THE REFERENCE NUMERALS

1 communication module
2 substrate
3 front surface (of substrate)
5 laser diode
6 photodiode
7 integrated circuit
8 resin package
9 light emitting surface
10 light receiving surface
11 driver circuit
12 receiving amplifier circuit
13 transistor element
14 package body
15 diffuser mounting base
16 convex lens
19 front surface (of package body)
20 bottom wall (of diffuser mounting base)
21 sidewall (of diffuser mounting base)
22 recess (of diffuser mounting base)
23 diffuser
24 diffusion surface
25 non-diffusion surface
26 adhesive
27 top surface (of sidewall of diffuser mounting base)
28 bottom surface (of recess of diffuser mounting base)
30 protective sheet
31 inclining surface (of recess of diffuser mounting base)
41 communication module
51 communication module
52 diffuser mounting recess
61 communication module
62 fine irregular portion
71 communication module
72 recess
75 light scatterer
76 filler
81 portable electronic device
82 device body

The invention claimed is:

1. A communication module comprising:
 a substrate;
 a laser element provided on a front surface of the substrate;
 a light receiving element provided on the front surface of the substrate and separated from the laser element;
 a transparent resin package collectively sealing the laser element and the light receiving element, the resin package including a package body sealing and adhering to the laser element and the light receiving element, and having a front package surface disposed upward of the laser element and parallel to the front surface of the substrate; and
 a diffusion unit provided to be opposed to a light emitting surface of the laser element at a prescribed distance for diffusing a laser beam emitted by the laser element, the light receiving element being disposed in a region that is not directly underneath the diffusion unit, the diffusion unit including a diffuser, which is separate and differs from the package body, having a diffusion surface and a non-diffusion surface on a side opposite to the diffusion surface, the diffuser being directly adhered to said front package surface disposed upward of the laser element in a posture directing the diffusion surface upward so that the diffusion surface faces upward,
 wherein a distance T between the laser element and the light receiving element satisfies a following formula (1):

$$T \geq t_1 \cdot \tan \theta + (t_1 + t_2) \cdot \tan \theta'$$

further wherein in the formula (1),
 $t_1$ represents a distance between the light emitting surface of the laser element and the diffusion unit,
 $\theta$ represents a maximum angle of emission of the laser element,
 $t_2$ represents a difference between
  a height from the front surface of the substrate up to the light emitting surface, and
  a height from the front surface of the substrate up to a light receiving surface of the light receiving element, and
 $\theta'$ represents a maximum diffusion angle of the diffusion unit.

2. The communication module according to claim 1, wherein the resin package includes a diffuser mounting recess, for storing the diffuser, formed on the front package surface.

3. The communication module according to claim 1, further comprising an adhesive made of a material having a same refractive index as a refractive index of the resin package for fixing the non-diffusion surface of the diffuser to the resin package.

4. The communication module according to claim 2, wherein
 the recess has a bottom surface opposed to the light emitting surface of the laser element, and
 the diffusion unit includes a filler made of resin containing a light scattering agent for filling up the recess of the resin package.

5. The communication module according to claim 1, wherein the resin package includes a convex lens, which is integrally supported by the package body, provided to be opposed to the light receiving surface of the light receiving element at a prescribed distance for converging light on the light receiving surface.

6. The communication module according to claim 1, further comprising a transistor element provided on the front surface of the substrate.

7. The communication module according to claim 6, wherein the transistor element includes a transistor element constituting a driver for controlling emission of a laser beam from the laser element.

8. The communication module according to claim 6, wherein the transistor element includes a transistor element constituting a receiving amplifier for amplifying an electric signal corresponding to light incident upon the light receiving element.

9. A portable electronic device comprising:
 the communication module according to claim 1; and
 a device body loaded with the communication module.

10. The communication module according to claim 1, further comprising an adhesive bonding the diffuser to the package body.

11. A communication module comprising:
 a substrate;
 a laser element provided on a front surface of the substrate;
 a light receiving element provided on the front surface of the substrate and separated from the laser element;
 a transparent resin package sealing and adhering to the laser element and the light receiving element, the resin package including a front package surface disposed upward of the laser element and parallel to the front surface of the substrate; and
 a diffusion unit provided to be opposed to a light emitting surface of the laser element at a prescribed distance for diffusing a laser beam emitted by the laser element, the diffusion unit including a diffuser, which is separate and differs from the resin package, having a diffusion surface and a non-diffusion surface on a side opposite to the diffusion surface, the diffuser being directly adhered to said front package surface disposed upward of the laser element in a posture directing the diffusion surface upward.

12. The communication module according to claim 11, further comprising an adhesive bonding the diffuser to the package body.

* * * * *

UNITED STATES PATENT AND TRADEMARK OFFICE
CERTIFICATE OF CORRECTION

PATENT NO. : 9,036,675 B2  
APPLICATION NO. : 14/001075  
DATED : May 19, 2015  
INVENTOR(S) : Akira Obika et al.

It is certified that error appears in the above-identified patent and that said Letters Patent is hereby corrected as shown below:

Title Page, Item 73 (Assignee)

"ROHM CO. LTD." should be changed to --ROHM CO., LTD.--

Signed and Sealed this
Twentieth Day of October, 2015

Michelle K. Lee  
*Director of the United States Patent and Trademark Office*